United States Patent [19]
Kaminow et al.

[11] 4,376,946
[45] Mar. 15, 1983

[54] SUPERLUMINESCENT LED WITH EFFICIENT COUPLING TO OPTICAL WAVEGUIDE

[75] Inventors: Ivan P. Kaminow, Tinton Falls; Dietrich Marcuse, Lincroft, both of N.J.

[73] Assignee: Bell Telephone Laboratories, Incorporated, Murray Hill, N.J.

[21] Appl. No.: 211,231

[22] Filed: Nov. 28, 1980

[51] Int. Cl.$^3$ .............................................. H01S 3/18
[52] U.S. Cl. .................................. 357/17; 350/96.15; 372/45
[58] Field of Search ...................... 357/17; 372/45, 46, 372/50; 350/96.11, 96.15, 96.17, 96.18

[56] References Cited
U.S. PATENT DOCUMENTS

| | | | |
|---|---|---|---|
| 3,958,265 | 5/1976 | Charmakadze | 357/17 |
| 4,024,559 | 5/1977 | de Cremoux | 357/17 |
| 4,199,222 | 4/1980 | Ikushima et al. | 350/96.19 |

OTHER PUBLICATIONS

Lee et al., "A Stripe-Geometry Double-Heterostructure Amplified-Spontaneous-Emission (Super-Luminescent) Diode", *IEEE J. of Quantum Elect.*, vol. QE-9, No. 8, Aug. 1973, pp. 820–828.
Yang et al., "Calculation of Coupling Losses Between Light Emitting Diodes and Low-Loss Optical Fibers", *Applied Optics*, vol. 14, No. 2, Feb. 1975, pp. 288–293.
Botez et al., "Channel Waveguide and Planar Edge-Emitting Double Heterojunction (AlGa)As LED's", *IBM Research Report*, RC 7115 (#30474) May 10, 1978, pp. 1–14.
Boeck et al., "AlGaAs/GaAs Double-Heterostructure Superluminescent Diodes for Optical Transmission Systems", *Frequenz*, vol. 33, No. 10, 1979, pp. 278–283.

*Primary Examiner*—James W. Davie
*Attorney, Agent, or Firm*—Daniel D. Dubosky

[57] ABSTRACT

Optical power is coupled into an optical waveguide system such as an optical fiber with maximum efficiency by a superluminescent light-emitting diode having lateral confinement of the light in the junction plane. The waveguide developed in the light-emitting diode is constructed to have an effective numerical aperture equal to the numerical aperture of the optical waveguide, and the refractive index n, the length L and width D of the waveguide in the diode is constructed such that the parameter nD/2L is much less than the numerical aperture. As a result, the inverted population of electrons within the active region are utilized with maximum efficiency to develop rays that are coupled into, and can be guided by, the optical waveguide system.

7 Claims, 3 Drawing Figures

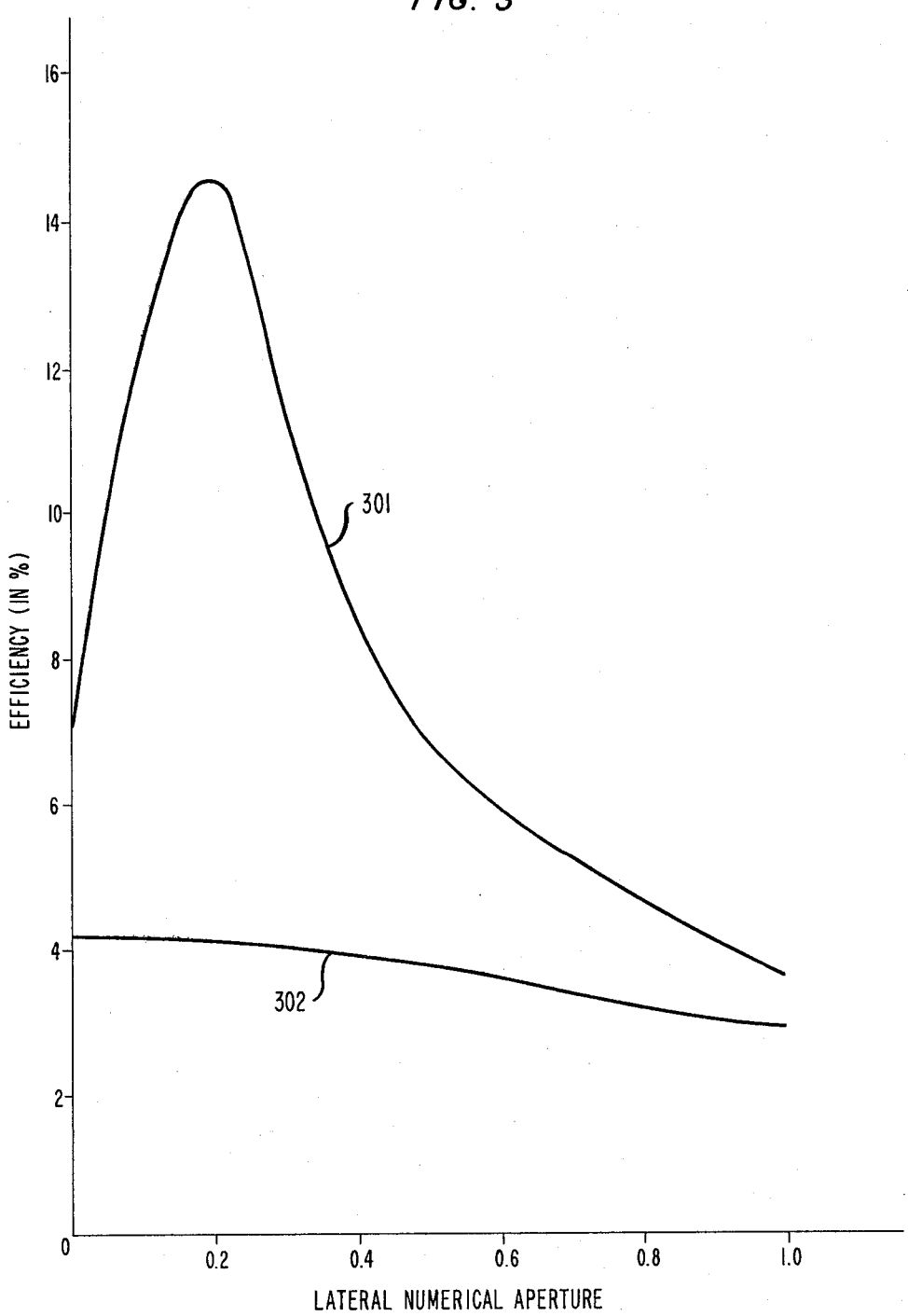

SUPERLUMINESCENT LED WITH EFFICIENT COUPLING TO OPTICAL WAVEGUIDE

BACKGROUND OF THE INVENTION

This invention relates to optical waveguide transmission systems and, more particularly, to superluminescent light-emitting diodes that can deliver light to an optical waveguide or fiber with maximum efficiency.

Although semiconductor lasers have achieved outstanding success in serving as optical sources in fiber waveguide systems, there are still many problems to be solved with respect to these devices. Specifically, many of the lasers do not have lifetimes that approach the other components in the fiber waveguide systems and their manufacturing yield is still not as high as desired. Some theories on the lack of an adequate laser lifetime have suggested that the presence of optical peaks within the cavity of the laser may, in fact, contribute to the rapid degradation of the device. Light-emitting diodes, on the other hand, produce incoherent radiation and, therefore, do not have standing waves of optical energy within their active region and for this reason may exhibit much longer lifetimes than their laser cousins. Light-emitting diodes manufactured to date, however, do not permit coupling the amount of optical power into a fiber that is required for systems applications and, therefore, the use of superluminescent light-emitting diodes (SLD) has been suggested. SLDs are superior to ordinary light-emitting diodes (LEDs) in that they have larger modulation bandwidth and smaller spectral width. In this type of light-emitting diode, the active region is pumped to a level such that gain is experienced by the light beams that are generated within the active region, but the device is purposely made to have no optical resonator to prevent laser oscillation.

One type of superluminescent light-emitting diode is disclosed in the article entitled "A Stripe-Geometry Double-Heterostructure Amplified-Spontaneous-Emission (Superluminescent) Diode" by T. P. Lee et al, *IEEE Journal of Quantum Electronics*, Vol. QE-9, No. 8, August 1973, pp. 820–828. In the SLD disclosed in this article a stripe-geometry current confining area is established by the contact on a double-heterostructure device and the contact is purposely made shorter than the overall length of the semiconductor chip in order to ensure that the radiation is absorbed in the unpumped region not covered by the contact. In this way, laser operation is prevented. The article by T. P. Lee et al also suggests making the "geometric" numerical aperture of the active region substantially equal to the numerical aperture of the fiber into which the light is to be coupled.

SUMMARY OF THE INVENTION

The present invention is based on the discovery that maximum efficiency can be achieved in coupling a superluminescent light-emitting diode to an optical fiber or other waveguide by providing lateral confinement of the optical energy within the active region of the light-emitting diode so as to form a waveguide within the active region whose effective lateral numerical aperture $NA_g$ (rather than the "geometric" numerical aperture) is made substantially equal to the numerical aperture $NA_f$ of the optical waveguide to be excited by the SLD. In addition, the SLD is constructed to have a pumped waveguide region with a length L, a width D, and an effective index of refraction n such that the "geometric" numerical aperture nD/2L is much less than the numerical aperture of the SLD guide. That is, $NA_g = NA_f$ and $nD/2L < NA_g$. As a result, the inverted population of carriers within the active region is most efficiently used to amplify rays of light that are all captured by the core of the fiber or external waveguide.

In the specific embodiment to be described, the waveguide within the SLD is achieved by ridge loading the active layer. The effective index of the active layer underneath the ridge area is higher than the effective index in the active layer outside of the ridge loaded area thereby producing a lateral waveguide within the active layer. In this ridge-loaded specific embodiment, a quaternary active layer using the elements indium, gallium, arsenic and phosphorous is epitaxially grown over an indium phosphide substrate and this quaternary layer is loaded with a ridge of indium phosphide. In other embodiments, the quaternary active layer may be isolated from the indium phosphide substrate by a second quaternary layer of different composition, and either of the structures may be fine tuned so as to achieve the optimum numerical aperture by interposing a third quaternary layer between the active layer and the indium phosphide ridge.

BRIEF DESCRIPTION OF THE DRAWING

The invention will be more readily understood after reading the following detailed description in conjunction with the drawing wherein:

FIG. 3 is a graph of the efficiency (in terms of optical power into the fiber over the electrical power delivered to the diode) versus the lateral numerical aperture of the waveguide within the active region layer of the diode.

DETAILED DESCRIPTION

Figure 1:
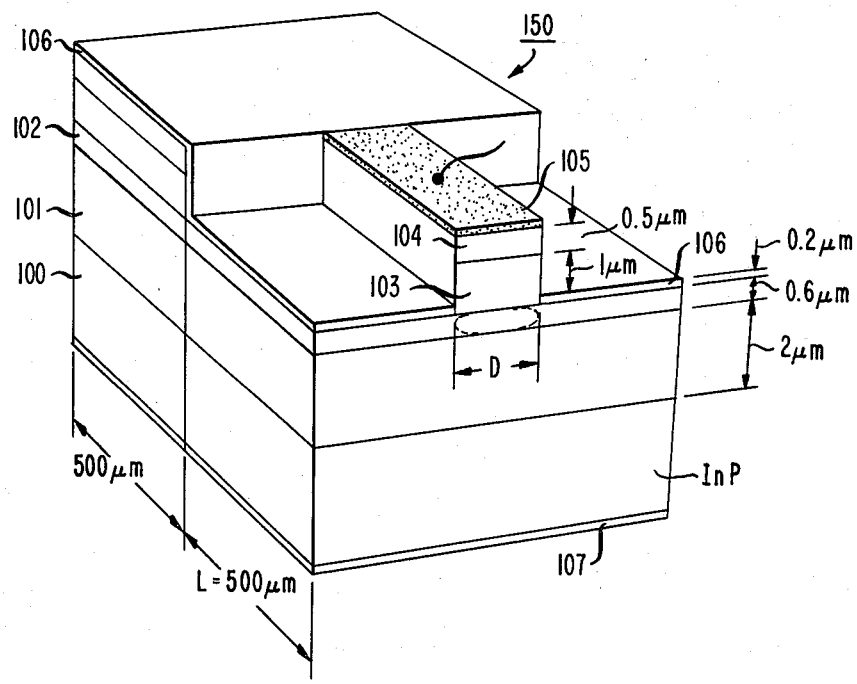
FIG. 1 is a pictorial illustration of a superluminescent light-emitting diode (SLD) constructed in accordance with the present invention to match a standard multimode optical fiber waveguide.

The superluminescent light-emitting diode (SLD) occupies a position intermediate between a light-emitting diode without gain and an injection laser. It radiates incoherent light, but it has high brightness, a narrowed spectral and radiation pattern, and large modulation bandwidth. The present invention is based on a study as to how to achieve maximum efficiency when coupling an SLD to an optical fiber waveguide. To achieve maximum efficiency in terms of the optical power coupled into the waveguide over the electrical power that is coupled into the SLD, lateral confinement of the optical energy within the SLD is achieved by constructing the SLD to have a waveguide in the junction plane of the active region layer. The study which was conducted simulated the performance of a strip-geometry SLD by a computer model. This program traced light rays from sources that were evenly distributed throughout the strip waveguide giving power contributions that are accumulated at discrete points inside the structure to compute the photon density and the power output at either end of the strip. The interplay between photon density, saturating the gain, and of the gain determining the photon density makes the problem nonlinear. Stationary solutions were obtained by successive iterations.

The results of the computer study can best be illustrated by referring to the graphs shown in FIG. 3 of the drawing. Both of these curves assume a strip waveguide structure in the SLD that has a reflection coefficient of zero at each end of the active region. They also both assume a numerical aperture for the optical fiber waveguide of 0.2. As is well known in the art, this is the typical numerical aperture achieved in multimode optical fibers presently constructed in accordance with the vapor deposition techniques. Both curves are plotted against an ordinate that represents efficiency in terms of optical power into the optical fiber guide divided by electrical power into the SLD, and an abscissa which represents the effective lateral numerical aperture of the waveguide within the active region of the device. In both curves the waveguide region has a width of D and a length of L, an effective index of refraction n and is pumped with a current density of 5000 amps per square centimeter. As indicated in FIG. 3 the device represented by curve 301 has a very large peak in efficiency at a point where the numerical aperture of the waveguide in the SLD equals the numerical aperture of the optical fiber. As opposed to the device represented by curve 302 where the efficiency at this numerical aperture of 0.2 is simply a little larger than the efficiency at larger numerical apertures.

The difference between the two devices represented by curves 301 and 302 can be specified in terms of the "geometric" numerical aperture parameter $nD/2L$ where n is the effective index of the waveguide, D is the width of the waveguide and L is the length of the waveguide. In curve 302 this parameter $nD/2L$ is equal to 0.28 or approximately equal to the numerical aperture of the optical fiber. In curve 301 where the device has achieved a critical peak in efficiency this parameter $nD/2L$ is equal to 0.035 or is much less than the numerical aperture of the optical waveguide. In effect, curve 301 represents a thin, highly elongated strip waveguide in the active region where the parameter $nD/2L$ is much less than the numerical aperture of the optical waveguide. In this case, the optical rays within the waveguide are permitted to use up the population inversion of electrons to primarily produce rays that are definitely captured by the core of the optical fiber, especially where this waveguide is caused to have a numerical aperture substantially equal to the numerical aperture of the optical waveguide. The efficiency in curve 301 drops off from the peak for numerical apertures that are less than optimum since this case represents less guiding of the optical rays and many of them are lost into the unpumped layer outside of the pumped region. The efficiency drops off for numerical apertures that are larger than the numerical aperture of the optical waveguide since for these cases the rays are even more tightly bound such that much of the inverted population of electrons is used up in producing rays that can never be captured by the core of the optical fiber.

In conclusion, our computer study has uncovered the following criteria for establishing maximum coupling efficiency between an SLD and an optical waveguide: (1) the numerical aperture achieved by lateral confinement in the active region of an edge-emitting strip SLD should be made approximately equal to the numerical aperture of the optical waveguide, and (2) the active region should be constructed to have an effective index n, width D, and length L, such that $nD/2L$ is much less than the numerical aperture of the optical waveguide. In all cases, however, it is of course, necessary to provide net gain in the SLD and to make the width of the active region in the SLD less than the width of the optical waveguide core.

One embodiment of an SLD that can be constructed to practice the present invention with a standard multimode optical fiber having a numerical aperture of 0.2 is illustrated in FIG. 1 of the drawing as SLD 150. As indicated in FIG. 1, a 2 micron layer 101 of indium phosphide is epitaxially grown on an indium phosphide substrate 100 followed by an InGaAsP active layer 102 epitaxially grown on layer 101 with a thickness of 0.6 microns. This layer 102 has its elements chosen such that a bandgap representing a wavelength of 1.3 microns is achieved. Layer 101 is grown with n-type doping. A p-type layer 103 of indium phosphide is epitaxially grown with a thickness of 1 micron on top of layer 102. Finally, a cap layer 104 with heavy p-type doping is epitaxially grown on layer 103 in order to achieve good electrical contact with the layers below it. Standard etching techniques are then utilized to form a ridge structure having a length L of 500 microns at one end of the device thereby leaving approximately 500 microns of original uncut layers 103 and 104 at the rear of the device to serve as an absorber. The entire top of the device except for the top of the ridge is then coated with a silicon nitride layer 106, and the top of the ridge is covered with an alloyed gold/zinc contact 105. The entire bottom of the device below substrate 100 is also covered with a gold/tin contact 107.

Lateral confinement will be provided in the active region of layer 102 by virtue of the fact that the ridge over the active region will cause that part of the active layer 102 to have a higher effective index than those parts in the active layer 102 that are not covered by the ridge. The numerical aperture of this waveguide $NA_g$ is equal to the $\sqrt{(N^2_1 - N^2_2)}$ where $N_1$ is the effective index of the active region in layer 102 underneath the ridge and $N_2$ is the effective index in regions of layer 102 that are not covered by the ridge structure. These effective indexes $N_1$ and $N_2$ can be computed using the techniques set forth by H. Kogelnik et al in their article entitled "Scaling Rules for Thin-Film Optical Waveguides," *Applied Optics*, Vol. 13, (1974), pp. 1857–1862.

For the structure shown in FIG. 1 with an active region thickness of 0.6 microns the numerical aperture is computed to be equal to 0.26 for the TE mode and equal to 0.44 for the TM mode. Another structure that has been found to yield numerical apertures that are close to the numerical aperture of a multimode fiber is one in which layer 101 is epitaxially grown as a quaternary layer having a bandgap equivalent to a wavelength of 1.1 $\mu$m. In this latter case the numerical aperture for the TE mode is equal to 0.26 and for the TM mode is equal to 0.36. In both of these cases the numerical apertures can be decreased slightly in order to even more closely match the optical waveguide by epitaxially growing a quaternary layer of index lower than layer 102 between layers 102 and 103 thereby in effect fine tuning the effective indexes in each of the regions.

Figure 2:
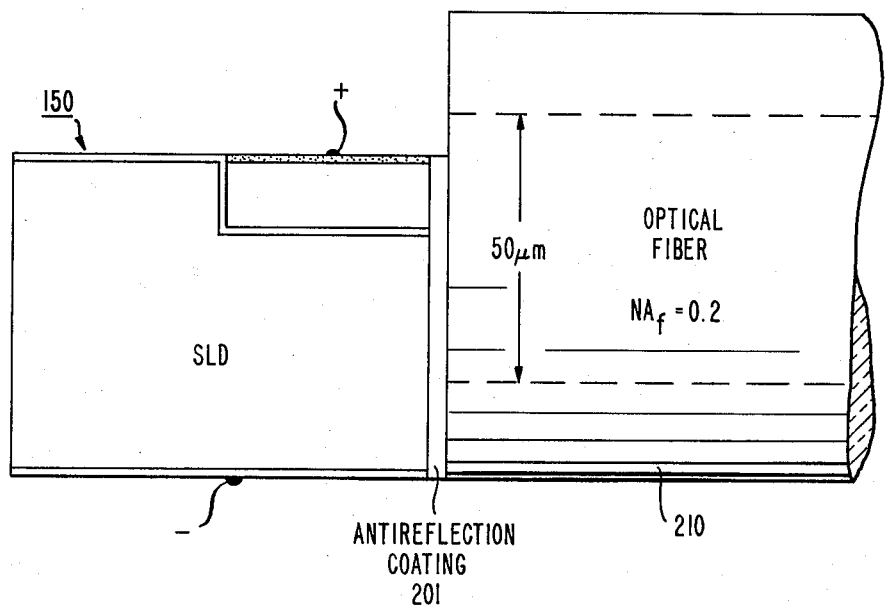
FIG. 2 is a pictorial representation of an SLD and multimode optical fiber positioned so as to practice the present invention.

The device as constructed, having lateral confinement so as to produce a numerical aperture approximately equal to that of the optical fiber waveguide, can then be mounted as illustrated in FIG. 2 so as to deliver its output radiation directly into the core of an optical fiber. Before mounting, the SLD is advantageously coated with an antireflection coating 201 which covers the entire light-emitting edge of the SLD 150. If the reflectivity at the output face is sufficiently small, an additional advantage in power output can be gained by replacing the absorber at the opposite end of the SLD by a mirror with finite reflectivity. It should be apparent to those skilled in the optical arts that coupling efficiency can be even further improved by interposing a cylindrical lens oriented parallel to the junction plane between the SLD and the optical fiber in order to more effectively capture the optical rays emitted by the active region of the SLD. This matching improves efficiency since the transverse numerical aperture perpendicular to the junction plane of this active region is usually very large relative to the numerical aperture of the optical fiber.

It should also be apparent to those skilled in the art that the present invention can be practiced by matching the numerical aperture of the SLD to the numerical aperture of an optical system into which it is coupling light. Accordingly, a standard spherical lens may also be interposed between the SLD and the optical fiber waveguide in order to transform both the width and the numerical aperture of the optical waveguide into an effective numerical aperture and width as seen by the SLD. This transformation, of course, will follow the standard optical relationship provided by the lens whereby the product of the width and numerical aperture remains constant in the transformation.

In addition, other techniques and methods known to those skilled in the semiconductor laser art can be utilized to realize the required lateral confinement in the SLD waveguide.

What is claimed is:

1. In combination, an edge-emitting, superluminescent light-emitting diode having an active layer with a pumped region of length L, and an output optical waveguide system having a core diameter greater than the width of the light-emitting region of said diode and a numerical aperture of $NA_f$, characterized in that the refractive indexes in said active layer adjacent to said pumped region in said superluminescent light-emitting diode are chosen to provide lateral confinement of light in the active layer of said diode to a waveguide region having a width D and a lateral numerical aperture $NA_g$ substantially equal to the numerical aperture $NA_f$ of said output optical waveguide system, the parameter $nD/2L$ being much less than the numerical aperture, $NA_g$ where n is the effective refractive index in the light-emitting region of said diode.

2. The combination as defined in claim 1 wherein said superluminescent light-emitting diode is further characterized in that the lateral confinement of light is achieved by a ridge structure that is present only over the light-emitting region of said light-emitting diode.

3. The combination as defined in claim 2 wherein the active layer of said superluminescent light-emitting diode is chemically composed of elements from the set including indium, gallium, arsenic and phosphorous.

4. The combination as defined in claim 3 wherein said ridge structure includes an indium phosphide layer epitaxially grown on said active layer.

5. The combination as defined in claim 1 wherein said superluminescent light-emitting diode has an antireflection coating over the light-emitting edge of said diode.

6. A superluminescent light-emitting diode comprising a substrate having at least one bottom epitaxial layer grown on one surface of said substrate, and a first contact bonded to an opposite surface of said substrate, an active layer epitaxially grown on said at least one bottom epitaxial layer, at least one top epitaxial layer grown on said active layer with a carrier type of polarity opposite to that of said at least one bottom layer and etched to provide a ridge type structure having a length L over at least a portion of said active layer, a second contact bonded to the top of said ridge thereby creating a strip light-emitting region in said active layer when current is applied to said first and second contacts, the thickness of said active layer and elements in said at least one top and bottom epitaxial layers being chosen such that the light is laterally confined in said active layer to a width of D with a numerical aperture $NA_g$, said width D and length L being chosen such that the parameter $nD/2L$ is much less than said $NA_g$ where n is the index of refraction in the active region of said active layer.

7. A superluminescent light-emitting diode as defined in claim 6 wherein said at least one bottom epitaxial layer and said at least one top epitaxial layer are composed of indium phosphide, and said active layer has a thickness of about 0.6 micrometers and is composed of elements from the set consisting of indium, gallium, arsenic, and phosphorous.

* * * * *